(12) United States Patent
Dier et al.

(10) Patent No.: US 10,331,048 B2
(45) Date of Patent: Jun. 25, 2019

(54) MIRROR, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Oliver Dier, Lauchheim (DE); Kerstin Hild, Schwaebisch Gmuend (DE); Hartmut Enkisch, Aalen (DE); Matus Kalisky, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/871,926

(22) Filed: Jan. 15, 2018

(65) Prior Publication Data

US 2018/0217507 A1 Aug. 2, 2018

Related U.S. Application Data

(63) Continuation of application No. PCT/EP2016/066178, filed on Jul. 7, 2016.

(30) Foreign Application Priority Data

Jul. 15, 2015 (DE) .................. 10 2015 213 253

(51) Int. Cl.
*G03B 27/54* (2006.01)
*G03F 7/20* (2006.01)
*G21K 1/06* (2006.01)

(52) U.S. Cl.
CPC .......... *G03F 7/70958* (2013.01); *G03F 7/702* (2013.01); *G03F 7/7015* (2013.01);
(Continued)

(58) Field of Classification Search
CPC ................... G02B 5/08; G02B 5/0808; G02B 5/0816–0875; G02B 5/0891; G02B 5/10;
(Continued)

(56) References Cited

U.S. PATENT DOCUMENTS

2003/0147058 A1* 8/2003 Murakami ............. B82Y 10/00
355/53
2007/0287076 A1 12/2007 Masaki
(Continued)

FOREIGN PATENT DOCUMENTS

DE 102009032779 A1 1/2011
DE 102009049640 A1 4/2011
(Continued)

OTHER PUBLICATIONS

International Search Report & Written Opinion in counterpart International Application No. PCT/EP2016/066178 dated Nov. 3, 2016.
(Continued)

*Primary Examiner* — Christina A Riddle
(74) *Attorney, Agent, or Firm* — Edell, Shapiro & Finnan, LLC

(57) ABSTRACT

A mirror, in particular for a microlithographic projection exposure apparatus, has an optically effective surface, a mirror substrate (205, 305), a reflection layer (220, 320), which is configured to provide the mirror with a reflectivity of at least 50% for electromagnetic radiation with a predetermined operating wavelength incident on the optically effective surface (200a, 300a) at angles of incidence in relation to the respective surface normals of at least 65°, and a substrate protection layer (210, 310) which is arranged between the mirror substrate (205, 305) and the reflection layer (220, 320). The substrate protection layer has a transmission of less than 0.1% for EUV radiation.

20 Claims, 7 Drawing Sheets

(52) U.S. Cl.
CPC ...... *G03F 7/70316* (2013.01); *G03F 7/70983* (2013.01); *G21K 1/062* (2013.01)

(58) Field of Classification Search
CPC . G02B 5/22; G02B 1/10; G02B 1/105; G02B 1/11; G02B 1/113; G02B 1/115; G02B 1/116; G02B 1/14; G02B 17/0892; G02B 17/02; G02B 17/06; G02B 17/08; G03F 1/24; G03F 1/54; G03F 1/58; G03F 1/52; G03F 7/70316; G03F 7/70958; G03F 7/7095; G03F 7/7058; G03F 7/7015; G03F 7/70175; G03F 7/70191; G03F 7/702; G03F 7/70216; G03F 7/70225; G03F 7/70233; G03F 7/70308; G03F 7/7055; G03F 7/70983; G03F 7/7075; G03F 7/70583; G21K 1/062; G21K 1/067
USPC ......... 355/52, 53, 55, 60, 66, 65, 67, 71–77; 359/359, 360, 838, 850, 884, 885, 584, 359/585, 589, 601, 883; 250/492.1, 250/492.2, 492.22, 492.23, 493.1, 505.1; 430/5
See application file for complete search history.

(56) References Cited

U.S. PATENT DOCUMENTS

| | | |
|---|---|---|
| 2010/0182710 A1 | 7/2010 | Dinger et al. |
| 2011/0090559 A1 | 4/2011 | Rennon et al. |
| 2012/0013976 A1 | 1/2012 | Weber |
| 2012/0182606 A1 | 7/2012 | Weissenrieder et al. |
| 2012/0212810 A1 | 8/2012 | Paul et al. |
| 2013/0038929 A1 | 2/2013 | Muellender et al. |
| 2013/0107239 A1 | 5/2013 | Clauss |
| 2014/0022525 A1 | 1/2014 | Enkisch et al. |
| 2014/0307308 A1 | 10/2014 | Weiss et al. |
| 2015/0116703 A1 | 4/2015 | Bittner et al. |
| 2016/0377984 A1 | 12/2016 | Enkisch |

FOREIGN PATENT DOCUMENTS

| | | |
|---|---|---|
| DE | 102009054653 A1 | 6/2011 |
| DE | 102011085358 B3 | 7/2012 |
| DE | 102011075579 A1 | 11/2012 |
| DE | 102012202675 A1 | 1/2013 |
| DE | 102011084117 A1 | 4/2013 |
| DE | 102014219755 A1 | 4/2015 |
| DE | 102015213249 A1 | 1/2017 |
| WO | 9202936 A1 | 2/1992 |
| WO | 2010022839 A2 | 3/2010 |
| WO | 2011006685 A1 | 1/2011 |
| WO | 2011117009 A1 | 9/2011 |
| WO | 2012104136 A1 | 8/2012 |

OTHER PUBLICATIONS

International Preliminary Report on Patentability in counterpart International Application No. PCT/EP2016/066178, dated Jan. 16, 2018, 16 pages.
Office Action in corresponding German Application 102015213253. 6, dated Feb. 6, 2016, along with English Translation.

* cited by examiner

MIRROR, IN PARTICULAR FOR A MICROLITHOGRAPHIC PROJECTION EXPOSURE APPARATUS

The present application is a continuation of International Application No. PCT/EP2016/066178, filed Jul. 7, 2016, which claims the priority under 35 U.S.C. § 119(a) of the German patent application DE 10 2015 213 253.6, filed on Jul. 15, 2015. The disclosures of both related applications are considered part of and are incorporated by reference into the disclosure of the present application in their respective entireties.

FIELD OF THE INVENTION

The invention relates to a mirror, in particular for a microlithographic projection exposure apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (=reticle) illuminated by way of the illumination device is in this case projected by way of the projection lens onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the extreme ultraviolet (EUV) range, e.g. at wavelengths of e.g. approximately 13 nm or approximately 7 nm, owing to the lack of availability of suitable light-transmissive refractive materials, mirrors are used as optical components for the imaging process.

Among others, the operation of mirrors under grazing incidence is known. Such mirrors operated under grazing incidence are understood here and in the following to mean mirrors for which the reflection angles, which occur during the reflection of the EUV radiation and relate to the respective surface normal, are at least 65°. Sometimes, such mirrors are also referred to in an abbreviated fashion as GI mirrors ("grazing incidence"). In principle, the use of such GI mirrors is desirable, inter alia in view of the comparatively high achievable reflectivities (of e.g. 80% and more).

In contrast to, for instance, mirrors operated under normal incidence (also referred to as NI mirrors; "normal incidence"), such GI mirrors do not require a multilayer system in the form of an alternating sequence of numerous individual layers made of at least two different layer materials as a reflection layer for obtaining the respective reflectivities; instead, they require only a single layer, which may, for example, consist of ruthenium (Ru) and which may, for example, have a typical layer thickness in the region of 40 nm.

However, even if GI mirrors are used, a problem occurring in practice, in particular in the projection lens, is that electromagnetic radiation, for example in the form of transmitted light or stray light, may reach through the respective reflection layer to the mirror substrate; for example, this is promoted by virtue of the relevant electromagnetic radiation differing from the actual used light in terms of the angle and/or wavelength distribution. The relevant electromagnetic radiation reaching the mirror substrate may then cause damage or changes, for example in the form of radiation-induced local density changes (compacting), in the mirror substrate material, which in turn leads to unwanted changes in the wavefront during the operation of the optical system and hence, ultimately, to an impairment of the performance of the optical system or the projection exposure apparatus.

In relation to the prior art, reference is made merely by way of example to DE 10 2009 032 779 A1, DE 10 2009 054 653 A1, US 2013/0038929 A1, DE 10 2009 049 640 A1 and DE 10 2012 202 675 A1.

SUMMARY

Against the above background, it is an object of the present invention to provide a mirror, in particular for a microlithographic projection exposure apparatus, which facilitates the use at a grazing incidence while at least largely avoiding the above-described problems.

According to one aspect of the invention, a mirror, in particular for a microlithographic projection exposure apparatus, comprises an optically effective surface, and:
- a mirror substrate,
- a reflection layer, which is configured such that the mirror has a reflectivity of at least 50% for electromagnetic radiation with a predetermined operating wavelength incident on the optically effective surface at an angle of incidence in relation to the respective surface normal of at least 65°; and
- a substrate protection layer which is arranged between the mirror substrate and the reflection layer, wherein the substrate protection layer has a transmission of less than 0.1% for EUV radiation.

In particular, this aspect of the invention is based on the concept of reducing or eliminating changes or damage to the mirror substrate material caused by electromagnetic radiation in a mirror designed for operation under grazing incidence, and hence reducing or eliminating accompanying unwanted wavefront changes during the operation of the respective optical system, by virtue of a substrate protection layer being arranged between the reflection layer of the mirror and the mirror substrate, said substrate protection layer keeping the relevant electromagnetic radiation away from the mirror substrate material as a result of a sufficient absorption effect.

According to an embodiment, the substrate protection layer has a transmission of less than 0.01%, in particular less than 0.001%, for EUV radiation. Preferably, the condition according to which the transmission for EUV radiation is less than 0.1%, in particular less than 0.01%, further particularly less than 0.001%, is also satisfied for other angles of incidence than the "operational angles", in particular also for EUV radiation that is incident in perpendicular fashion on the substrate protection layer. Moreover, the condition according to which the transmission of the substrate protection layer is less than 0.1%, in particular less than 0.01%, further particularly less than 0.001%, is preferably also satisfied for other wavelengths than the operating wavelength.

In embodiments of the invention, the substrate protection layer according to the invention is configured such that, in addition to the above-described protection of the mirror substrate from electromagnetic radiation, a layer stress compensation is further obtained in the entire layer structure of the mirror.

According to an embodiment, the substrate protection layer has, to this end, at least one layer stress compensation layer made of a second material.

Such a layer stress (which may be present in the form of compressive stress or tensile stress, depending on the specific embodiment of the reflection layer of the GI mirror) may lead to a deformation of the mirror substrate and hence likewise to unwanted changes in the wavefront during the operation of the respective optical system if no further measures are taken.

For at least partly compensating said layer stress, the substrate protection layer according to the invention may also have, as a multilayer system, an alternating sequence of absorber layers (effectuating the substrate protection from electromagnetic radiation) made of a first material and layer stress compensation layers (at least partly compensating said layer stress) made of a second material.

According to the invention, the circumstances that the existing requirements on a layer stress compensation are, as a rule, significantly lower in the case of a mirror configured for operation under grazing instrument (GI mirror) than in the case of a mirror configured for operation under normal incidence (NI mirror) can be exploited in an advantageous manner. The occurring layer stresses (which, for instance, typically may be of the order of 200 MPa-600 MPa, depending on the production method, in the case of a reflection layer stack of an NI mirror) are greater in absolute terms in the case of a GI mirror (with a typical layer stress of 800 MPa-1200 MPa), but lead to effectively smaller deformations as a consequence of the lower overall thickness of the reflection layer.

Moreover, in the case of a GI mirror, the wavefront modifications possibly caused by said layer stresses are less pronounced since these wavefront modifications ultimately scale with the overall layer thickness which, in turn, is substantially lower in the case of a GI mirror (e.g. with a reflection layer made of ruthenium with a thickness of approximately 40 nm) than in the case of an NI mirror, the reflection layer stack of which in the form of an alternating sequence of molybdenum and silicon layers may typically have, for example, an overall layer thickness in the region of 350 nm.

The consequently reduced requirements, as described above, on a layer stress compensation in a GI mirror can now be exploited by the invention by virtue of the aforementioned stress compensation layers in the structure of the substrate protection layer according to the invention being able to be reduced in terms of their proportion or their respective layer thickness, as a consequence of which the overall thickness of the layer structure in the GI mirror can also be restricted or reduced accordingly.

This, in turn, has as a consequence that effects that scale with the layer thickness, such as for example stray light components caused by the layer structure and also wavefront effects of possible layer thickness errors, are ultimately less strongly pronounced.

As a result, it is consequently possible, according to the invention, to achieve an effective protection of the mirror substrate from electromagnetic radiation and a reduction or minimization of unwanted wavefront modifications during the operation of an optical system having a GI mirror according to the invention.

In embodiments of the invention, the stress compensation layers may have, in particular, a thickness of at most 5 nm.

Depending on the specific embodiment of the reflection layer in the GI mirror according to the invention, the requirements on a layer stress compensation may even be reduced to virtually zero, with the consequence that it is ultimately sufficient for the substrate protection layer according to the invention to consist exclusively of the described absorber layer—possible stress compensation layers being dispensed with. Here, the further circumstances, which are advantageous in comparison to NI mirrors that "roughening effects", which may be relatively strongly pronounced in the case of NI mirrors and may therefore already possibly require so-called "interruption layers", are less problematic in the case of a GI mirror, can also be used, and so, under this aspect too, the realization of the substrate protection layer according to the invention as a single layer (made of only an absorber layer) comes into question.

According to an embodiment, the first material is selected from the group containing iron (Fe), nickel (Ni), cobalt (Co), copper (Cu), silver (Ag), gold (Au), platinum (Pt), germanium (Ge), tungsten (Wo), chromium (Cr), tin (Sn), zinc (Zn), indium (In), tellurium (Te), iridium (Ir), palladium (Pd), osmium (Os), tantalum (Ta) and alloys thereof.

According to an embodiment, the second material is selected from the group containing molybdenum (Mo), ruthenium (Ru), boron (B), boron carbide ($B_4C$), carbon (C) and silicon (Si).

According to a further aspect of the invention, discussed below, the configuration of the substrate protection layer according to the invention and, in particular, further of the reflection layer as well are preferably effectuated such that the period length of the multilayer system forming the substrate protection layer—and hence, ultimately, also the lateral thickness profile of the substrate protection layer—is accessible to measurements in the easiest possible way. As a result of this, it is possible, according to the invention, to account for the further problem that a respectively desired, typically constant thickness profile of the substrate protection layer can only be realized with a finite accuracy as a matter of principle; thus, a certain lateral thickness variation of the substrate protection layer is unavoidable in practice. In order now to be able to compensate such an unwanted thickness variation either already in the relevant mirror itself (by optimizing the layer thickness profile) or elsewhere in the relevant optical system, information that is as exact as possible about the relevant layer thickness profile is required.

In the advantageous configuration, described below, of the period length of the multilayer system forming the substrate protection layer on the one hand and, optionally, of the thickness of the reflection layer as well on the other hand, the invention proceeds from the consideration that, as a matter of principle, the relationship between the period length of the multilayer system forming the substrate protection layer on the one hand and the spectral peak position in the dependence of the reflectivity on the wavelength of the incident electromagnetic radiation, ascertained for the relevant mirror through reflectometry, on the other hand can be used to determine said period length and hence, in the case of measurements at a plurality of locations on the mirror, the lateral thickness profile, wherein in this reflectometry measurement the electromagnetic radiation is directed in a substantially perpendicular fashion (preferably with an angle of incidence of at most 10° in relation to the respective surface normal) onto the mirror.

Although the reflectivities obtained in this case for the mirror (designed for operation under grazing incidence) are comparatively low (e.g. lower by a factor of 100) (relative to an NI mirror designed for perpendicular light incidence), they are equally characteristic for said period length of the multilayer system forming the substrate protection layer, as will still be explained in detail below. If the period length of the multilayer system is predetermined in a suitable manner, the spectral peak position in the wavelength-dependent reflectivity profiles obtained for the relevant mirror can now become accessible using a reflectometer, which is available or present for EUV lithography in any case, and hence said peak position can easily be determined by measurement.

According to an embodiment, the substrate protection layer has a multilayer system made of a plurality of individual layers.

According to an embodiment, these individual layers have a maximum thickness of less than 100 nm, in particular of less than 50 nm, more particularly of less than 25 nm.

According to an embodiment, the multilayer system has an alternating sequence of first layers made of a first material and second layers made of a second material, which differs from the first material.

According to an embodiment, this multilayer system has a period length in the range of 6 nm to 8 nm, in particular in the range of 6.5 nm to 7.5 nm.

According to an embodiment, the overall layer thickness, which the mirror has above the maximum of a standing wave field produced by the multilayer system, corresponds to an integer multiple of the period length of the multilayer system, apart from a maximum deviation of ±10%.

As a result of this choice of layer thicknesses or the matching thereof to the period length of the multilayer system forming the substrate protection layer, it is possible—as will likewise still be explained in more detail below—to obtain a profile of the respective peak in the wavelength-dependence of the reflectivity which is comparatively expedient in terms of the evaluation because it is still substantially symmetrical. Here, this concept according to the invention is based on the further consideration that the aforementioned overall layer thickness (including the thickness of the reflection layer) influences the spectral profile of the reflectivity of the relevant mirror to the extent that a standing wave field, which continues through the reflection layer up to the vacuum adjoining the mirror, is produced by the multilayer system forming the substrate protection layer. The choice of the aforementioned overall layer thickness as an integer multiple of the period length in this context leads to, as will still be explained in more detail below, a particularly pronounced peak or a comparatively strong oscillation of the electric field strength being able to be obtained at the interface between the reflection layer and the vacuum, with the consequence that the ultimately sought-after spectral peak position can also be determined particularly well by measurement.

The ascertainment of the lateral profile of the period length of the multilayer system forming the substrate protection layer by reflectometry, which is described above and will also still be explained in more detail below, can alternatively be carried out either prior to the application of the reflection layer or else after the application thereof (i.e. by coupling the electromagnetic radiation through said reflection layer). Expressed differently, the invention firstly comprises embodiments in which a reflectometric characterization is carried out initially for the substrate protection layer itself (still without the reflection layer situated thereon) and only subsequently or sequentially carried out, when necessary, for the then-applied reflection layer. Secondly, the invention however also comprises embodiments in which the determination of the spectral peak position of the reflectivity of the multilayer system forming the substrate protection layer still is effectuated after applying the reflection layer, while reducing the measurement outlay or the number of process steps required.

According to an embodiment, the operating wavelength is less than 30 nm, and, in particular, it can lie in the range of 10 nm to 15 nm.

The invention further relates to an optical system of a microlithographic projection exposure apparatus, said optical system having at least a mirror with the features described above.

According to an embodiment, this mirror is arranged in the optical system such that the reflection angles in relation to the respective surface normal, occurring during the operation of the optical system upon reflection of electromagnetic radiation at the mirror, are at least 50°, in particular at least 65°.

The invention further also relates to a microlithographic projection exposure apparatus, having an illumination device and a projection lens, wherein the illumination device, during the operation of the projection exposure apparatus, illuminates a mask situated in an object plane of the projection lens and the projection lens images structures on said mask onto a light-sensitive layer situated in an image plane of the projection lens, wherein the projection exposure apparatus has an optical system with the features described above.

Further configurations of the invention can be gathered from the description and the dependent claims.

The invention is explained in greater detail below on the basis of exemplary embodiments illustrated in the accompanying figures.

DETAILED DESCRIPTION

Figure 1:
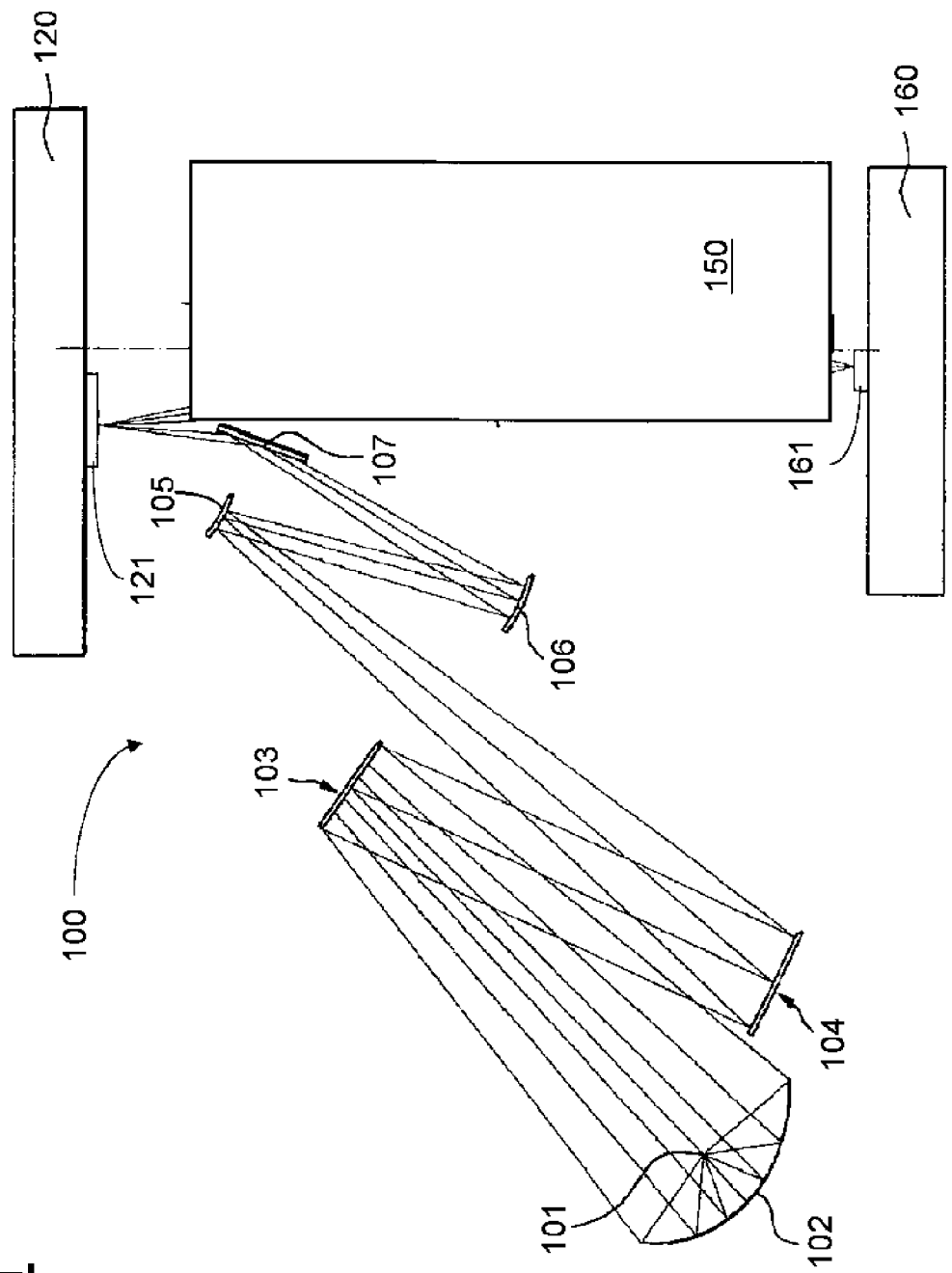
FIG. 1 shows a schematic illustration of a projection exposure apparatus designed for operation in the EUV.

FIG. 1 shows a schematic illustration of an exemplary projection exposure apparatus 100 which is designed for operation in the EUV and in which the present invention can be realized.

According to FIG. 1, an illumination device of the projection exposure apparatus 100 comprises a field facet mirror 103 and a pupil facet mirror 104. The light from a light source unit comprising a plasma light source 101 and a collector mirror 102 is directed onto the field facet mirror 103. A first telescope mirror 105 and a second telescope mirror 106 are arranged in the light path downstream of the pupil facet mirror 104. A deflection mirror 107 operated with grazing incidence is arranged downstream in the light path and directs the radiation impinging on it onto an object field in the object plane of a projection lens, which is illustrated merely generally in FIG. 1. At the location of the object field, a reflective structure-bearing mask 121 is arranged on a mask stage 120, said mask being imaged with the aid of a projection lens 150 into an image plane in which a substrate 161 coated with a light-sensitive layer (photoresist) is situated on a wafer stage 160.

The structure according to the invention of a mirror operated under grazing incidence may be realized, for example, in one or more mirrors of the projection lens 150 or else in the deflection mirror 107 provided within the illumination device.

Below, possible embodiments of a mirror operated under grazing incidence in accordance with the present invention are described with reference to the schematic images of FIGS. 2-3.

Figure 2:
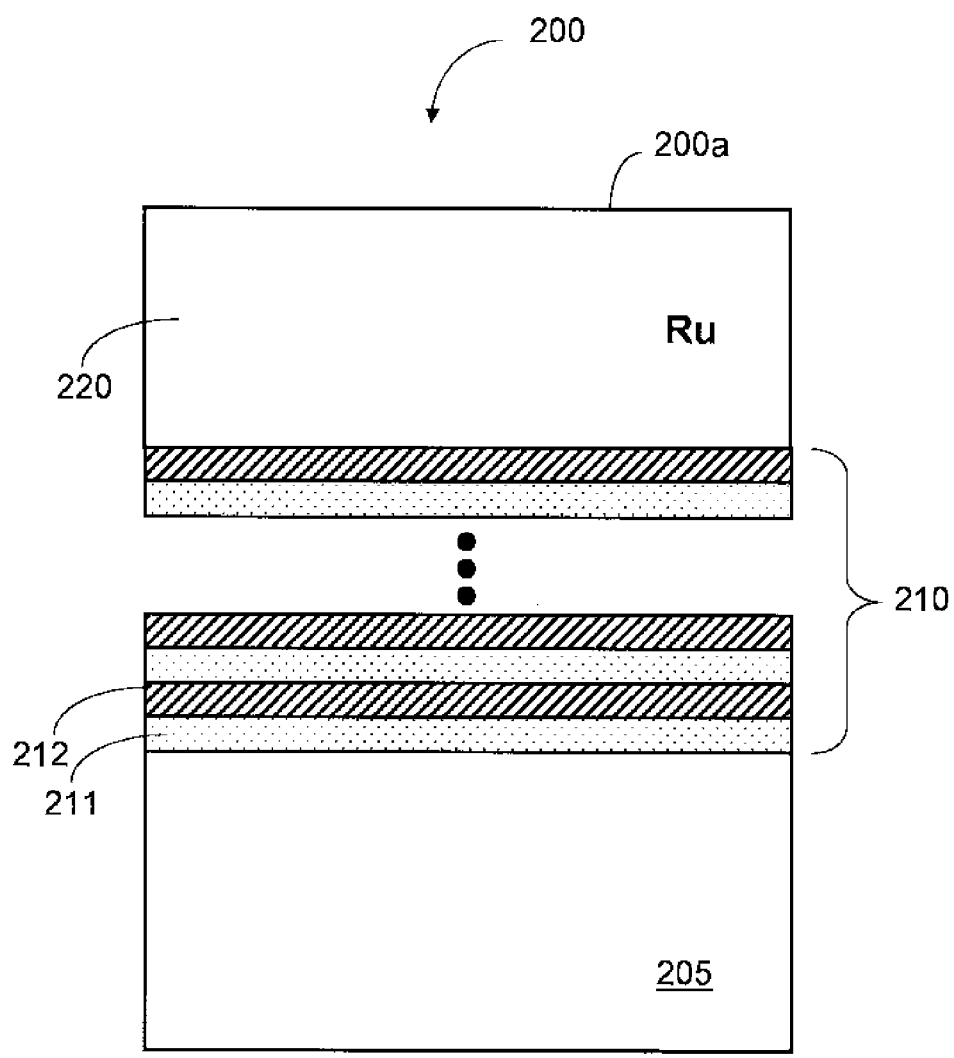
FIG. 2 shows a schematic illustration of a first exemplary structure of an inventive mirror.

According to FIG. 2, in a first embodiment, a mirror 200 designed for operation under grazing incidence may have, in a manner known per se, a mirror substrate 205 (which may be produced from any suitable substrate material, for example a titanium silicate glass distributed under the trademark ULE® by Corning Inc.) and a reflection layer 220 embodying the optically effective surface 200a, said reflection layer being produced from ruthenium (Ru) in the exemplary embodiment and being able to have typical exemplary thickness in the range from 20 nm to 200 nm. In further embodiments, use likewise can be made of layer systems, known per se, for GI mirrors with more than a single (e.g. ruthenium (Ru)) layer.

In respect of exemplary possible layer designs of GI mirrors, reference is made to e.g. DE 10 2011 075 579 A1.

In order to protect the mirror substrate 205 from electromagnetic radiation that impinges on the optically effective surface 200a during operation of the mirror 200 and passes through the reflection layer 220 as a consequence of transmission e.g. through the ruthenium (Ru) layer, the mirror 200 has a substrate protection layer 210 between the reflection layer 220 and the mirror substrate 205.

In the exemplary embodiment of FIG. 2, the substrate protection layer 210 has an alternating succession of absorber layers 212 made of a first material (with a correspondingly high absorption component in the refractive index, e.g. silver (Ag), platinum (Pt), tin (Sn), zinc (Zn), copper (Cu), tungsten (W), nickel (Ni) or cobalt (Co)) and layer stress compensation layers 211 made of a second material (e.g. molybdenum (Mo) or ruthenium (Ru)). The layer stress compensation layers 211 serve to compensate an unwanted mechanical layer stress that may be present in the entire layer structure of the mirror 200. The absorber layers 212 ensure that electromagnetic radiation, for instance in the form of stray light, is kept away from the mirror substrate 205. This is made possible through the low transmission of said absorber layers for EUV radiation (in particular less than 0.1%, particularly less than 0.01%, further particularly less than 0.001%). Such electromagnetic radiation should be avoided because it can potentially cause compacting of, or another type of damage to, the mirror substrate material at said mirror substrate.

The overall period number of the alternating sequence within the substrate protection layer 210 may lie, in particular, in the range from 10 to 40 (wherein each period corresponds to a partial stack made of, respectively, an absorber layer 212 and a layer stress compensation layer 211). Moreover, the thickness of the layer stress compensation layers 211 may lie, in a purely exemplary manner, in the range of 2 nm to 4 nm. In particular, the thickness of the layer stress compensation layers 211 can be significantly lower than in the case of an (NI) mirror designed for operation under normal incidence, wherein there is advantageous exploitation of the fact that the layer-stress-dependent bending, which may have to be compensated, is substantially lower in the case of the mirror 200 operated under grazing incidence in accordance with FIG. 2 than in the case of said NI mirror.

Figure 3:
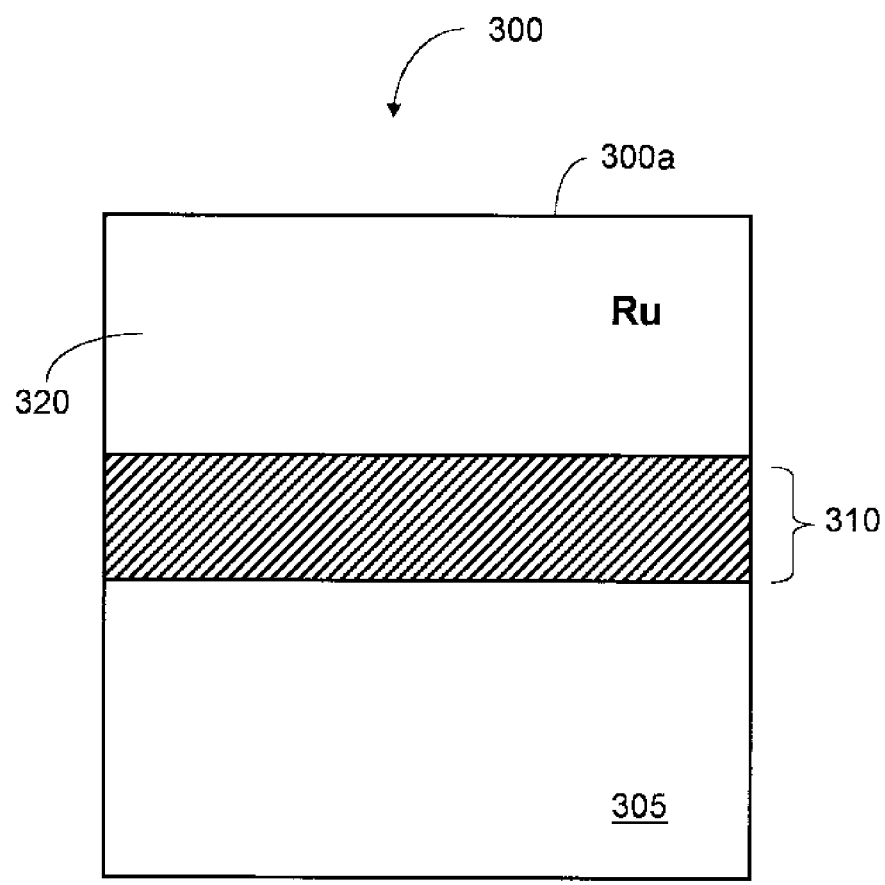
FIG. 3 shows a schematic illustration of a second exemplary structure of an inventive mirror.

FIG. 3 shows a schematic illustration for explaining a further exemplary embodiment of a mirror according to the invention, wherein components analogous or substantially functionally equivalent in comparison with FIG. 2 are designated by reference numerals increased by "100."

In the mirror 300 according to FIG. 3, the substrate protection layer 310 consists of only an absorber layer with an overall thickness of typically 50 nm or 100 nm, as required to absorb the electromagnetic radiation potentially passing through the reflection layer 320. In this embodiment, additional layer stress compensating layers or a corresponding alternating layer structure in the substrate protection layer 310 has been dispensed with entirely and the substrate protection layer consequently consists only of a single absorber layer analogous to the absorber layer 212. Such a configuration is suitable, in particular, if a mechanical layer stress present within the reflection layer 320 is negligibly small.

In further embodiments, the substrate protection layer present, according to the invention, between the mirror substrate and the reflection layer may also be produced from a suitable material which satisfies both the function of the absorber layers 212 from FIG. 2 (i.e. absorption of electromagnetic radiation, such as transmitted light or stray light, passing through the reflection layer) and the function of the layer stress compensation layers 211 (i.e. compensation of a mechanical layer stress present in the entire layer structure of the mirror). Under the precondition of a sufficiently high absorption, use can be made of e.g. alloys of the aforementioned absorber materials—silver (Ag), platinum (Pt), tin (Sn), zinc (Zn), copper (Cu), tungsten (W), nickel (Ni), cobalt (Co)—with e.g. silicon (Si), vanadium (V), carbon (C), boron (B) or molybdenum (Mo) to this end. Depending on the absorption behavior, the layer thicknesses may be between 50 and 300 nm. Likewise, the layer stress can be set over a broad range (e.g. from +1000 MPa to −1000 MPa) for both purely elemental absorber layers and for alloys by way of a suitable choice of the process parameters.

The invention is realizable, in particular in an advantageous manner, in a projection lens which has at least a mirror for grazing incidence of the illumination light (with angles of incidence greater than 65°), for example in a projection lens as shown in DE 10 2012 202 675 A1. In further exemplary embodiments, the invention can also be implemented in projection lenses having a different structure or in other optical systems.

Below and with reference to FIGS. 4-6, embodiments of the invention are described, in which an advantageous configuration of the multilayer system forming the substrate protection layer and optionally of the reflection layer, too, is realized to the extent that this configuration is particularly expedient for ascertaining the lateral thickness profile of the substrate protection layer by measurement. Such an ascertainment of the lateral thickness profile by measurement is desirable, as in turn already described at the outset, in order to be able to compensate unwanted deviations of this thickness profile from a sought-after, e.g. typically constant thickness profile (wherein said compensation may be carried out either in the layer thickness profile of the relevant mirror itself or else elsewhere in the optical system).

To this end, FIGS. 4A-4D initially respectively show wavelength dependences of the reflectivity of a mirror according to the invention, wherein the individual reflectivity profiles are plotted for different values of the period length of the multilayer system forming the substrate protection layer (from d=6 nm to d=8 nm) and for different thicknesses of the reflection layer (which is 25 nm in FIG.

Figure 4A:
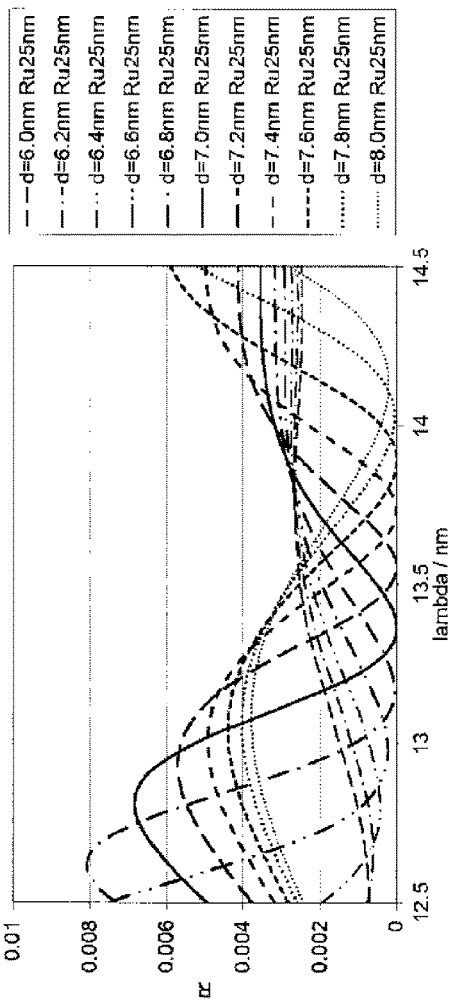
FIGS. 4A-4D show diagrams for explaining further possible embodiments of inventive optical systems having differing respective reflection layer thicknesses.
Figure 4B:
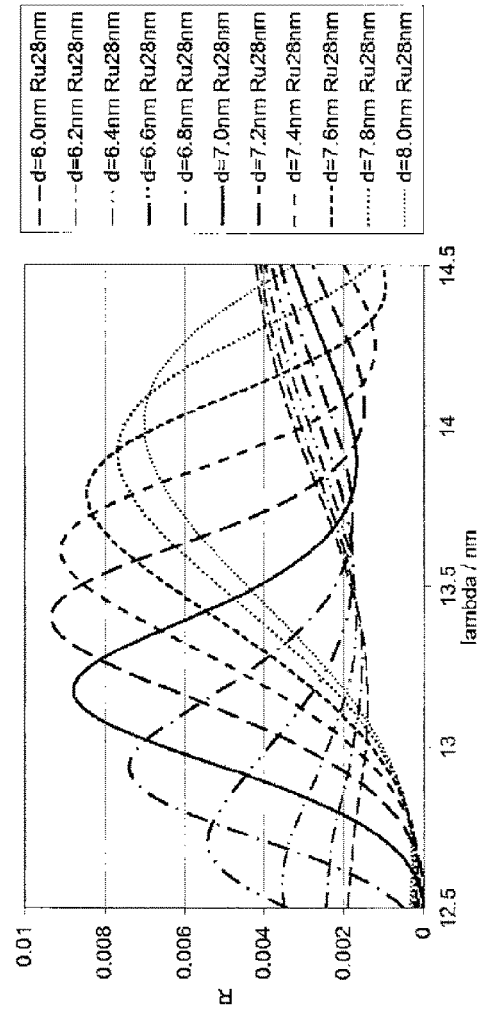
Figure 4C:
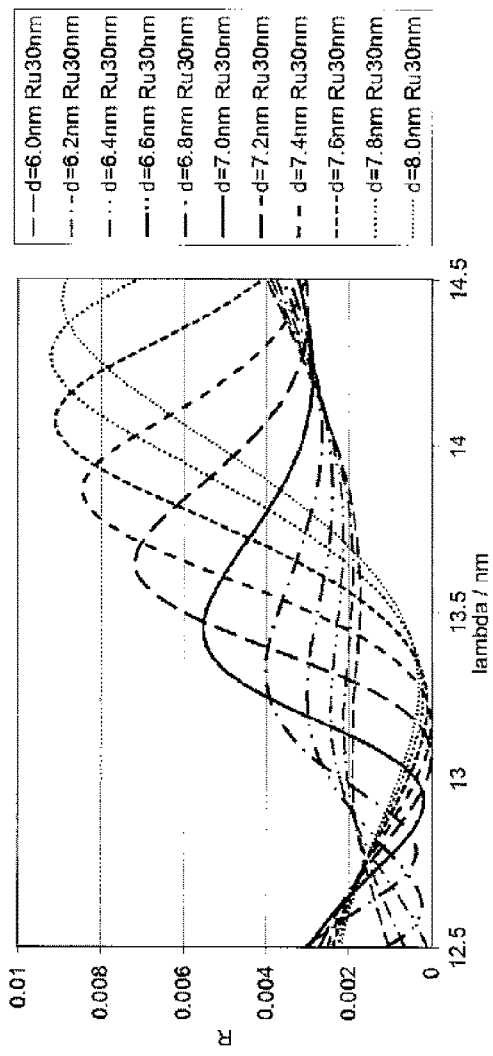
Figure 4D:
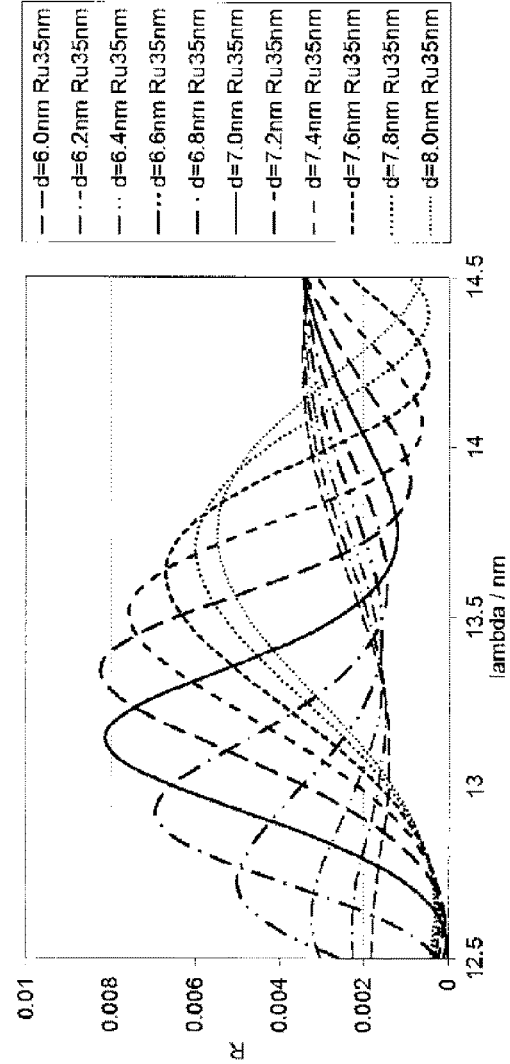

4A, 28 nm in FIG. 4B, 30 nm in FIG. 4C and 35 nm in FIG. 4D). It can be seen that the spectral peak position respectively lies between 12.5 nm and 14.5 nm for the selected period lengths and consequently it lies in the region which is accessible by measurement in any case for reflectometers that are conventional and available in the EUV range.

Figure 5:
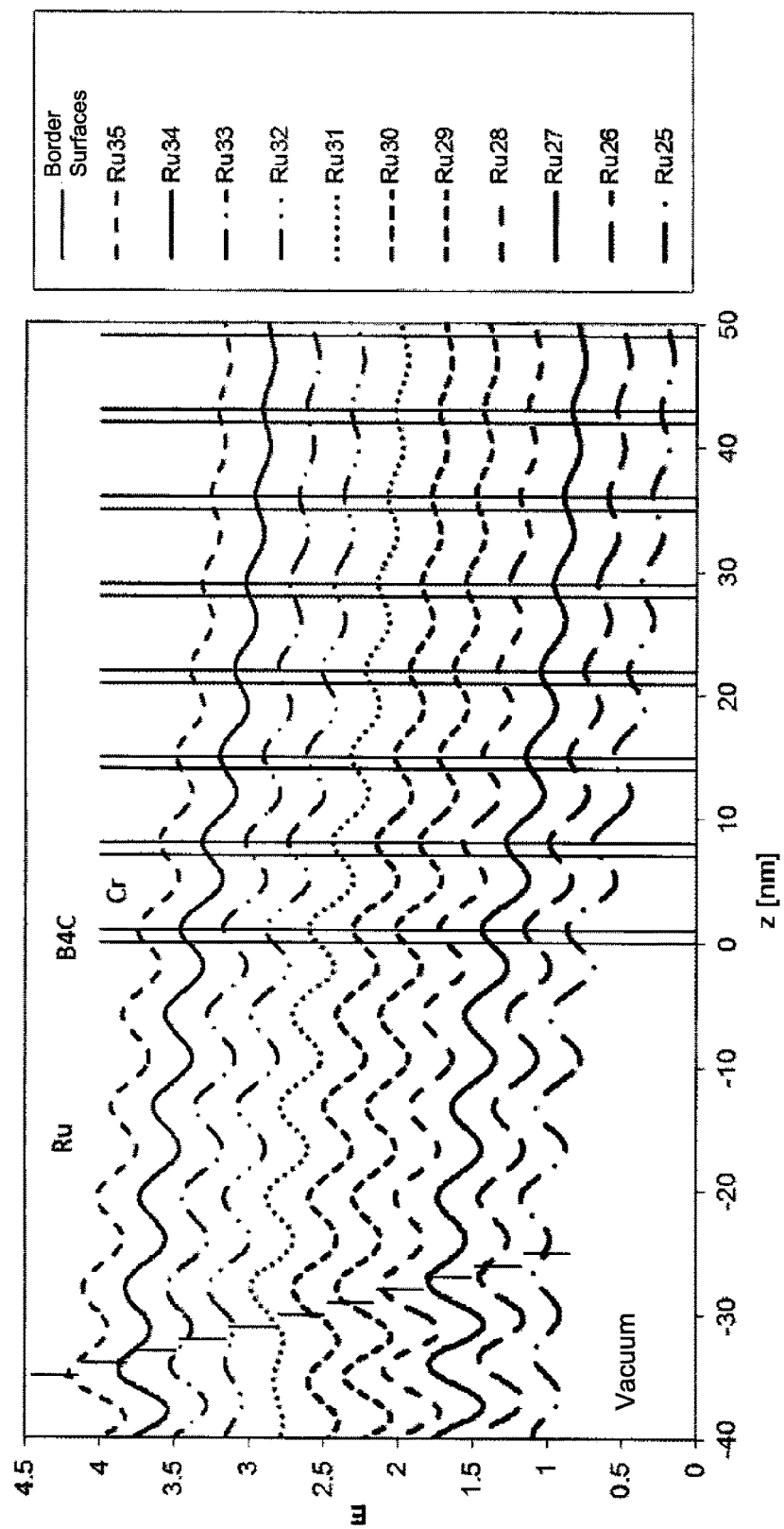
FIG. 5 depicts standing wave fields at various interfaces between various layers of an inventive optical system.
Figure 6A:
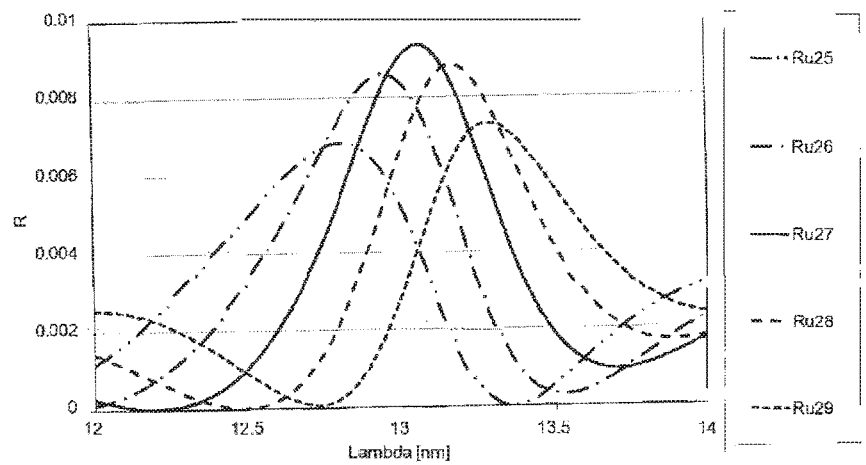
FIGS. 6A-6C show diagrams for explaining further possible embodiments of the inventive optical system having differing respective layer thicknesses.
Figure 6B:
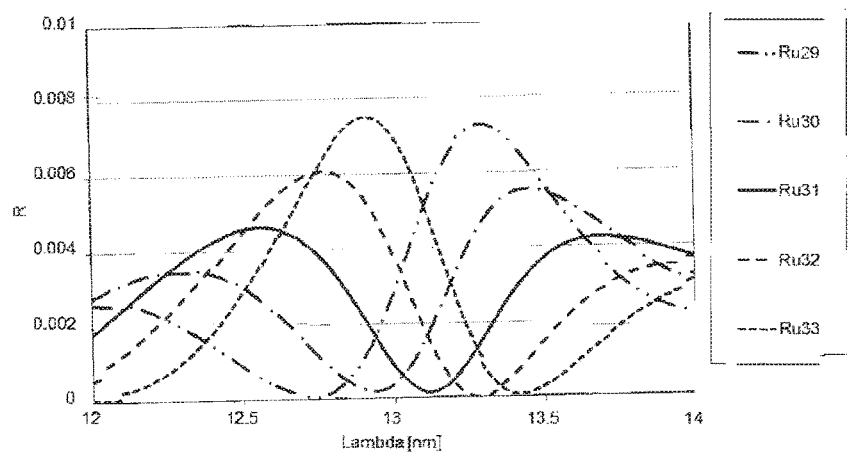
Figure 6C:
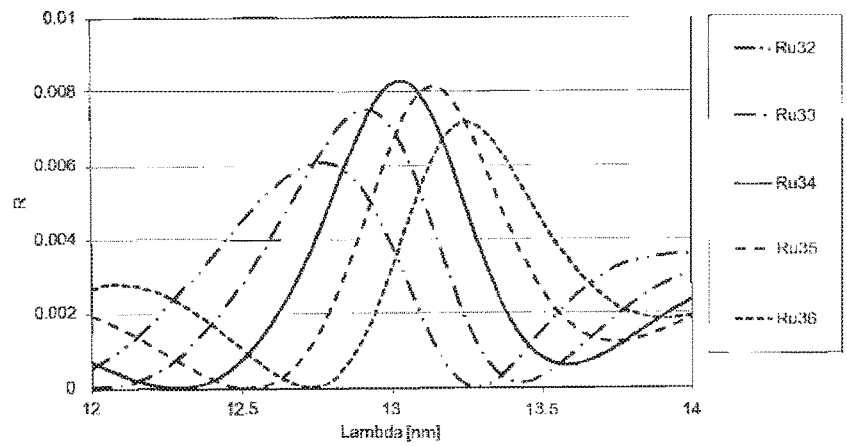

FIG. 5 shows a diagram for elucidating a standing wave field, produced by the multilayer system forming the substrate protection layer, in the individual regions of a mirror according to the invention and, in particular, at the interfaces between the substrate protection layer or multilayer system, reflection layer and vacuum. Here, the multilayer system forming the substrate protection layer is embodied as an alternating sequence of boron carbide ($B_4C$) and chromium (Cr) layers in the exemplary embodiment (without, however, the invention being restricted thereto), wherein the reflection layer, likewise in a purely exemplary manner, consists of ruthenium (Ru). FIGS. 6A-6C show the respective reflectivities in terms of their wavelength profile, depending on the thickness of the reflection layer.

Here, the individual curves in FIG. 5 correspond to different thicknesses of the reflection layer, wherein the respective interfaces between the reflection layer and vacuum are indicated by short perpendicular lines for the different samples. It is clear from FIG. 5 that the oscillation of the electric field strength in the vacuum is particularly strong if the relevant interface between reflection layer and vacuum is situated in the vicinity of a maximum of the standing wave field (which is given for thicknesses of the reflection layer of 27 nm and 34 nm in the illustrated example). By contrast, if the relative interface lies near a minimum of the standing wave field (as is the case for a thickness of the reflection layer of 31 nm in the example), the relevant oscillation of the field strength is particularly small. The upshot of this is that a pronounced peak in the wavelength-dependence of the reflectivity is obtained when the overall thickness of the layers above the maximum of the standing wave field in the multilayer system is selected such that it corresponds approximately to an integer multiple of the period length of the multilayer system.

Even though the invention has been described on the basis of specific embodiments, numerous variations and alternative embodiments are apparent to a person skilled in the art, for example by combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. An optical system of a microlithographic projection exposure apparatus comprising at least one mirror having an optically effective surface, wherein the mirror comprises:
   a mirror substrate:
   a reflection layer, which is configured such that the mirror has a reflectivity of at least 50% for electromagnetic radiation with a predetermined operating wavelength incident on the optically effective surface at an angle of incidence relative to respective surface normals of at least 65°; and
   a substrate protection layer system which is arranged between the mirror substrate and the reflection layer, wherein the substrate protection layer system has a transmission of less than 0.1% for extreme ultraviolet (EUV) radiation, wherein the substrate protection layer system comprises a multilayer system of alternating layers of an absorber layer comprising a first material, and a stress compensation layer comprising a second material;
   wherein the mirror is arranged in the optical system such that the reflection angles in relation to the respective surface normals, which occur during operation of the optical system upon reflection of electromagnetic radiation at the mirror, are at least 50°.

2. The optical system as claimed in claim 1, wherein the substrate protection layer system has a transmission of less than 0.01% for EUV radiation.

3. The optical system as claimed in claim 2, wherein the transmission of the substrate protection layer system is less than 0.001% for EUV radiation.

4. The optical system as claimed in claim 1, wherein the first material is selected from the group containing iron (Fe), nickel (Ni), cobalt (Co), copper (Cu), silver (Ag), gold (Au), platinum (Pt), germanium (Ge), tungsten (W), chromium (Cr), tin (Sn), zinc (Zn), indium (In), tellurium (Te), iridium (Ir), palladium (Pd), osmium (Os), tantalum (Ta) and alloys thereof.

5. The optical system as claimed in claim 1, wherein the second material is selected from the group containing molybdenum (Mo), ruthenium (Ru), boron (B), boron carbide ($B_4C$), carbon (C) and silicon (Si).

6. The optical system as claimed in claim 1, wherein individual layers of the substrate protection layer system have a maximum thickness of less than 100 nm.

7. The optical system as claimed in claim 6, wherein the maximum thickness of the individual layers is less than 25 nm.

8. The optical system as claimed in claim 1, wherein the multilayer system has a period length between 6 nm and 8 nm.

9. The optical system as claimed in claim 8, wherein the period length of the multilayer system is between 6.5 nm and 7.5 nm.

10. The optical system as claimed in claim 1, wherein the operating wavelength is less than 30 nm.

11. The optical system as claimed in claim 10, wherein the operating wavelength is between 10 nm and 15 nm.

12. The optical system as claimed in claim 1, wherein the mirror is arranged in the optical system such that the reflection angles in relation to the respective surface normals, occurring during operation of the optical system upon reflection of electromagnetic radiation at the mirror, are at least 65°.

13. A microlithographic projection exposure apparatus having an illumination device and a projection lens, wherein the illumination device, during operation of the projection exposure apparatus, illuminates a mask situated in an object plane of the projection lens, and the projection lens images structures on said mask onto a light-sensitive layer situated in an image plane of the projection lens, wherein the projection exposure apparatus has at least an optical system as claimed in claim 1.

14. An optical system of a microlithographic projection exposure apparatus comprising at least one mirror having an optically effective surface, wherein the mirror comprises:
   a mirror substrate;
   a reflection layer, which is configured such that the mirror has a reflectivity of at least 50% for electromagnetic radiation with a predetermined operating wavelength incident on the optically effective surface at an angle of incidence relative to respective surface normals of at least 65°; and a substrate protection layer which is arranged between the mirror substrate and the reflection layer, wherein the substrate protection layer has a transmission of less than 0.1% for extreme ultraviolet (EUV) radiation, wherein the substrate protection layer comprises a multilayer system having an alternating sequence of first layers made of a first material and second layers made of a second material, which differs from the first material, and wherein an overall layer thickness, which the mirror has above the maximum of a standing wave field produced by the multilayer system, corresponds to an integer multiple of the period length of the multilayer system, apart from a maximum deviation of ±10%.

15. The optical system as claimed in claim 14, wherein the first layers are absorber layers and the second layers are layer stress compensation layers.

16. A microlithographic projection exposure apparatus having an illumination device and a projection lens, wherein the illumination device, during operation of the projection exposure apparatus, illuminates a mask situated in an object plane of the projection lens, and the projection lens images structures on said mask onto a light-sensitive layer situated in an image plane on the projection lens, wherein the projetion exposure apparatus has at least an optical system as claimed in claim 14.

17. The optical system as claimed in claim 14, wherein the multilayer system has a period length between 6 nm and 8 nm.

18. The optical system as claimed in claim 14, wherein the period length of the multilayer system is between 6.5 nm and 7.5 nm.

19. The optical system as claimed in claim 14, wherein the operating wavelength is between 10 nm and 15 nm.

20. The optical system as claimed in claim 14, wherein the mirror is arranged in the optical system such that the reflection angles in relation to the respective surface normals, occurring during operation of the optical system upon reflection of electromagnetic radiation at the mirror, are at least 65°.

* * * * *

UNITED STATES PATENT AND TRADEMARK OFFICE
CERTIFICATE OF CORRECTION

PATENT NO. : 10,331,048 B2  
APPLICATION NO. : 15/871926  
DATED : June 25, 2019  
INVENTOR(S) : Oliver Dier et al.

It is certified that error appears in the above-identified patent and that said Letters Patent is hereby corrected as shown below:

In the Specification

Column 4, Line 12, Delete "(Wo)," and insert -- (W), --, therefor.

Column 6, Line 43, Delete "thicknesses;" and insert -- thicknesses. --, therefor.

In the Claims

Column 9, Line 55, In Claim 1, delete "substrate:" and insert -- substrate; --, therefor.

Column 12, Line 3, In Claim 16, delete "on" and insert -- of --, therefor.

Column 12, Line 4, In Claim 16, delete "projetion" and insert -- projection --, therefor.

Signed and Sealed this  
Thirtieth Day of June, 2020

Andrei Iancu  
*Director of the United States Patent and Trademark Office*